United States Patent
Hwang et al.

(10) Patent No.: US 9,093,633 B2
(45) Date of Patent: Jul. 28, 2015

(54) CHARGING DEVICE WITH PIEZOELECTRIC-COMPOSITE AND ULTRASONIC APPARATUS WITH THE SAME

(71) Applicant: Electronics and Telecommunications Research Institute, Daejeon (KR)

(72) Inventors: Gunn Hwang, Daejeon (KR); WooSub Youm, Daejeon (KR); Sung Q Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 151 days.

(21) Appl. No.: 13/937,125

(22) Filed: Jul. 8, 2013

(65) Prior Publication Data

US 2014/0167564 A1    Jun. 19, 2014

(30) Foreign Application Priority Data

Dec. 14, 2012  (KR) .................. 10-2012-0146858

(51) Int. Cl.
| | | |
|---|---|---|
| *H01L 41/113* | (2006.01) | |
| *H01L 41/047* | (2006.01) | |
| *H01L 41/18* | (2006.01) | |
| *H02N 2/18* | (2006.01) | |

(52) U.S. Cl.
CPC ............ *H01L 41/047* (2013.01); *H01L 41/113* (2013.01); *H01L 41/183* (2013.01); *H02N 2/18* (2013.01)

(58) Field of Classification Search
CPC ....... H01L 41/136; H02N 2/183; H02N 2/186
USPC .......................................................... 310/339
See application file for complete search history.

(56) References Cited

U.S. PATENT DOCUMENTS

| | | | |
|---|---|---|---|
| 2007/0184238 A1* | 8/2007 | Hockaday et al. ............. | 428/98 |
| 2010/0258160 A1* | 10/2010 | Wang et al. ................... | 136/246 |
| 2012/0231349 A1 | 9/2012 | Moon et al. | |
| 2012/0320492 A1* | 12/2012 | Radivojevic et al. ......... | 361/291 |
| 2013/0162192 A1* | 6/2013 | Park et al. ..................... | 320/101 |

OTHER PUBLICATIONS

Wei-Li Li et al., "Gel Polymer Electrolyte with Semi-IPN Fabric for Polymer Lithium-Ion Battery", Journal of Applied Polymer Science, 2012, pp. 1027-1032, vol. 125, Wiley Periodicals, Inc.

* cited by examiner

*Primary Examiner* — Thomas Dougherty

(57) ABSTRACT

Provided is an ultrasonic apparatus. The ultrasonic apparatus may include a charging device, a circuit device electrically connected to the charging device, and a housing part for packaging the charging device and the circuit device. Here, the charging device may include a lower electrode, an upper electrode provided on the lower electrode, a plurality of pillar-shaped piezoelectric composites provided between the lower and upper electrodes, and an electrolyte layer provided between the lower and upper electrodes to fill spaces between the pillar-shaped piezoelectric composites.

20 Claims, 4 Drawing Sheets

CHARGING DEVICE WITH PIEZOELECTRIC-COMPOSITE AND ULTRASONIC APPARATUS WITH THE SAME

CROSS-REFERENCE TO RELATED APPLICATIONS

This U.S. non-provisional patent application claims priority under 35 U.S.C. §119 to Korean Patent Application No. 10-2012-0146858, filed on Dec. 14, 2012, in the Korean Intellectual Property Office, the entire contents of which are hereby incorporated by reference.

BACKGROUND OF THE INVENTION

Example embodiments of the inventive concept relate to a piezoelectric composite and an ultrasonic apparatus with the same, and in particular, to a charging device with a piezoelectric composite and an ultrasonic apparatus with the same.

An ultrasonic apparatus is realized using a ceramic/polymer composite. A lead-zirconate-titanate (PZT) based piezoelectric material exhibits an excellent piezoelectric property at each vibration mode (e.g., $d_{33}$~510 pC/N and $d_{31}$~−230 pC/N) but exhibits a disadvantage of small hydrostatic pressure piezoelectric property ($d_h$).

Generally, the PZT has a small hydrostatic pressure piezoelectric property ($d_h = d_{33} + 2d_{31}$) of about 50 pC/N, and thus, to increase $d_h$ of the ultrasonic apparatus, $d_{31}$, transversal vibration mode, is decreased and $d_{33}$, a vibration mode in a thickness direction, is constantly preserved. In addition, since the pure PZT has a very high density, in-water impedance thereof is very different from that of water. This leads to a problem in transceiving operations of the ultrasonic apparatus. For example, if a sonic wave is incident from a low density medium (e.g., water) to a high density medium (e.g., ceramics), a dense medium does not absorb and reflect the sonic wave, and thus, the reception ratio is decreased. A ceramics-polymer piezoelectric composite has been developed as the one of alternatives to the PZT based piezoelectric material.

The piezoelectric composite can be classified into ten types (e.g., 1-3, 2-2, 0-3, 3-3, and so forth) according to its vibration mode, where the front number is a dimension of ceramics and the rear number is a dimension of epoxy. For example, 1-3 mode piezoelectric composite describes a three-dimensional polymer matrix and one-dimensional piezoelectric fiber inserted therein, and 2-2 mode piezoelectric composite describes a plate-shaped piezoelectric material inserted into a plate-shaped polymer. The most typical type of the ceramics-polymer composite is a 1-3 mode ceramics-polymer piezoelectric composite. In this case, $d_{33}$ can be maintained constantly by arranging the piezoelectric composite along a specific direction, and $d_{31}$ mode is suppressed by separating the piezoelectric fibers from each other. Accordingly, $d_h$ can be increased. Since the polymer has a low density, the total impedance can be greatly reduced. Accordingly, it is possible to achieve an impedance matching between water and the piezoelectric composite, and an operation of transceiving a sonic wave can be executed with an increased efficiency.

In the meantime, a lithium ion battery and a lithium polymer battery are two typical examples of lithium secondary battery. The lithium ion battery includes an electrolyte layer and an isolation layer, but it suffers from instability, limitations in shape and capacity, and a difficulty of fabrication process. The lithium polymer battery includes a polymer electrolyte serving as both of the electrolyte and isolation layers, thereby overcoming the technical problems of the lithium ion battery. Recently, a research on a monomer electrolyte layer is being conducted.

The polymer electrolyte can be classified into solid-type and gel-type, depending on whether it contains an organic electrolyte or not. The solid-type polymer electrolyte suffers from low ion conductivity and bad mechanical property, and thus, the gel-type polymer electrolyte has been researched for commercialization.

SUMMARY

Example embodiments of the inventive concept provide a charging device with a piezoelectric composite.

Other example embodiments of the inventive concept provide a charging device has a transversal cross section shaped like a circle or polygon where a center is hollowed or filled.

Another example embodiments of the inventive concept provide an ultrasonic apparatus, in which a charging device including a piezoelectric composite is provided to improve space efficiency.

According to example embodiments of the inventive concepts, a charging device may include a lower electrode, an upper electrode provided on the lower electrode, a plurality of pillar-shaped piezoelectric composites provided between the lower and upper electrodes, and an electrolyte layer provided between the lower and upper electrodes to fill spaces between the pillar-shaped piezoelectric composites.

In example embodiments, the pillar-shaped piezoelectric composite may include a piezoelectric material and a polymer surrounding the piezoelectric material, and the piezoelectric material has a transversal length shorter than a longitudinal length.

In example embodiments, the pillar-shaped piezoelectric composite may include a 1-3 mode piezoelectric composite.

In example embodiments, the pillar-shaped piezoelectric composite has a transversal cross section shaped like a circle or polygon.

In example embodiments, the electrolyte layer may be gel-type or solid-type.

In example embodiments, the electrolyte layer may be solid-type, and the electrolyte layer has through holes corresponding to the pillar-shaped piezoelectric composites.

In example embodiments, the electrolyte layer may include a monomer or polymer electrolyte material.

In example embodiments, the charging device may further include a piezoelectric composite supporting part provided below the lower electrode to support the pillar-shaped piezoelectric composites. The lower electrode has through holes corresponding to the pillar-shaped piezoelectric composites.

In example embodiments, the charging device may further include a piezoelectric composite supporting part provided on the lower electrode to support the pillar-shaped piezoelectric composites.

In example embodiments, the lower and upper electrodes may have a transversal cross section shaped like a circle or polygon.

In example embodiments, the charging device may further include sidewall electrodes disposed on a sidewall of the electrolyte layer. The sidewall electrodes are spaced apart from each other. The sidewall electrodes are spaced apart from the lower and upper electrodes. The lower and upper electrodes are used as a charging electrode. The sidewall electrodes are used as a discharging electrode.

According to other example embodiments of the inventive concepts, an ultrasonic apparatus may include the charging device described above, a circuit device electrically connected to the charging device, and a housing part for packaging the charging device and the circuit device.

In example embodiments, the pillar-shaped piezoelectric composite has a transversal length shorter than a longitudinal length.

In example embodiments, the pillar-shaped piezoelectric composite may be a 1-3 mode piezoelectric material.

In example embodiments, the pillar-shaped piezoelectric composite has a transversal cross section shaped like a circle or polygon.

In example embodiments, the electrolyte layer may be gel-type or solid-type.

In example embodiments, the electrolyte layer may be solid-type, and the electrolyte layer has through holes corresponding to the pillar-shaped piezoelectric composites.

In example embodiments, the electrolyte layer may include a monomer or polymer electrolyte material.

In example embodiments, the ultrasonic apparatus may further include a piezoelectric composite supporting part provided below the lower electrode to support the pillar-shaped piezoelectric composites. The lower electrode has through holes corresponding to the pillar-shaped piezoelectric composites.

In example embodiments, the lower and upper electrodes have a transversal cross section shaped like a circle or polygon.

In example embodiments, the circuit device may be a printed circuit board.

In example embodiments, the upper electrode may be used as a part of the housing part, and the housing part may be configured to have a structure that can be vertically deformed by a physical force applied to the upper electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
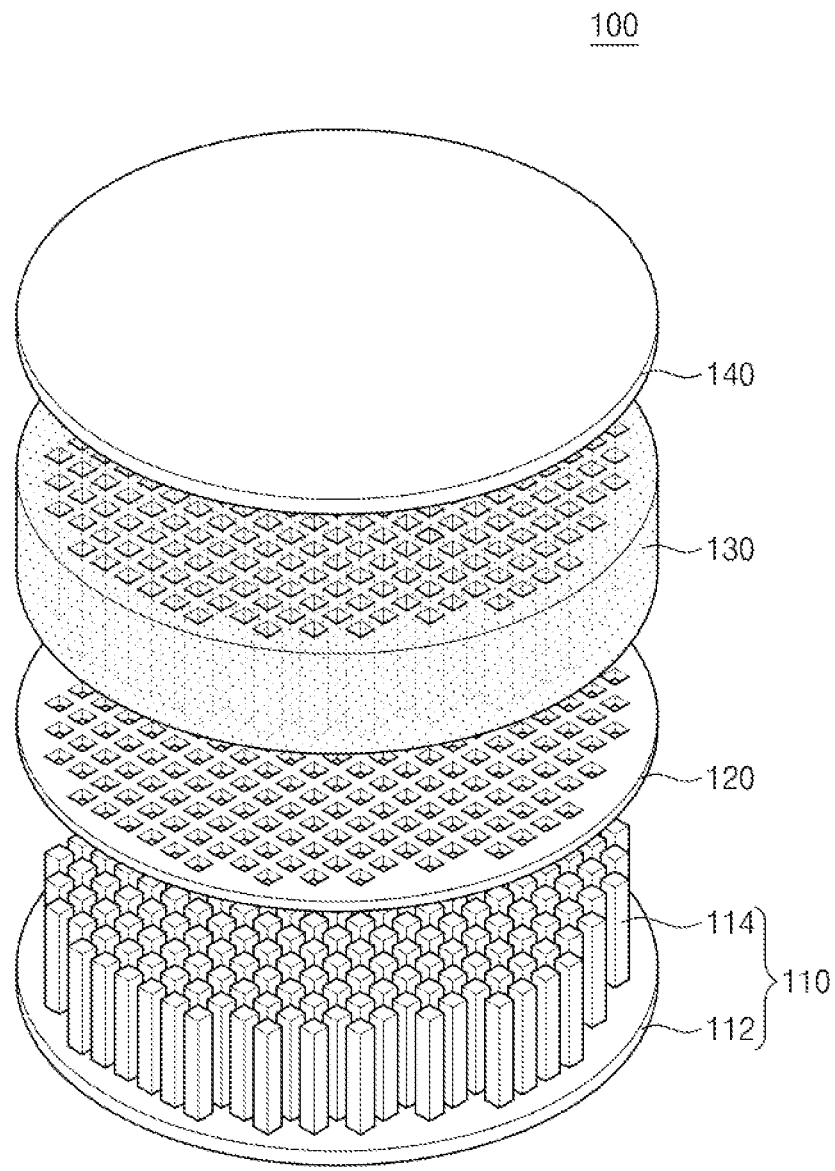
FIG. 1 is an exploded perspective view illustrating a charging device including a piezoelectric composite according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
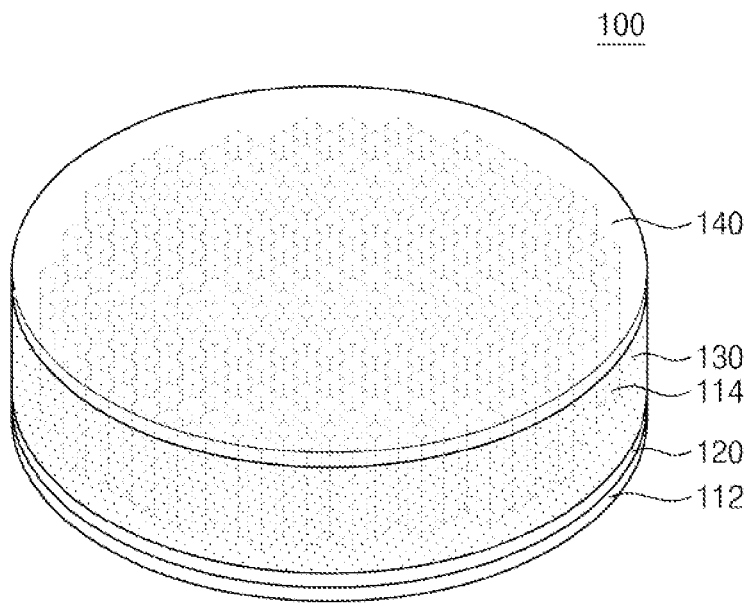
FIG. 2 is a combined perspective view illustrating the charging device of FIG. 1.

FIG. 1 is an exploded perspective view illustrating a charging device including a piezoelectric composite according to example embodiments of the inventive concept, and FIG. 2 is a combined perspective view illustrating the charging device of FIG. 1.

Referring to FIGS. 1 and 2, a charging device 100 may include a piezoelectric composite 110, a lower electrode 120, an electrolyte layer 130, and an upper electrode 140.

The piezoelectric composite 110 may include pillar-shaped piezoelectric composites 114 and a piezoelectric composite supporting part 112 connecting and supporting them. The pillar-shaped piezoelectric composites 114 may include a piezoelectric material and a polymer surrounding the piezoelectric material. The pillar-shaped piezoelectric composites 114 may be configured to have a transversal or horizontal length shorter than a longitudinal or vertical length. The pillar-shaped piezoelectric composites 114 may include a 1-3 mode piezoelectric composite. The pillar-shaped piezoelectric composites 114 are shown to have a rectangular vertical cross section, but example embodiments of the inventive concepts may not be limited thereto. For example, the pillar-shaped piezoelectric composites 114 may have a circular or polygonal vertical cross section. In addition, the piezoelectric composite supporting part 112 is shown to have a circular transversal cross section, but example embodiments of the inventive concepts may not be limited thereto. The piezoelectric composite supporting part 112 may have a transversal cross section shaped like a polygon.

The lower electrode 120 may be uses as an anode or a cathode of the charging device 100 and may include through holes that are formed to correspond to the pillar-shaped piezoelectric composites 114. The lower electrode 120 may include at least one conductive material. The lower electrode 120 is shown to have a circular transversal cross section, but example embodiments of the inventive concepts may not be limited thereto. For example, the lower electrode 120 may have a transversal cross section shaped like a polygon.

The electrolyte layer 130 may be provided to fill spaces between the pillar-shaped piezoelectric composites 114. The electrolyte layer 130 may be gel-type or solid-type. If the electrolyte layer 130 is solid-type, the electrolyte layer 140 may have through holes that are formed to correspond to the pillar-shaped piezoelectric composites 114. If the electrolyte layer 130 is gel-type, the pillar-shaped piezoelectric composites 114 may be provided through the electrolyte layer 130, and thus, there is no need to form the through holes.

The upper electrode 140 may be uses as an anode or a cathode of the charging device 100 and may include at least one conductive material. The upper electrode 140 is shown to have a circular transversal cross section, but example embodiments of the inventive concepts may not be limited thereto. For example, the upper electrode 140 may have a transversal cross section shaped like a polygon.

Although not shown, the piezoelectric composite supporting part 112 or the upper electrode 140 may further include a housing part surrounding sidewalls of the lower electrode 120 and the electrolyte layer 130. In the case where the electrolyte layer 130 is gel-type, the housing part may contribute to prevent the electrolyte layer 130 from being extruded from the charging device 100 by an external force (depicted by an arrow in FIG. 6), such as vibration or pressure, applied to the upper electrode 140.

Figure 3:
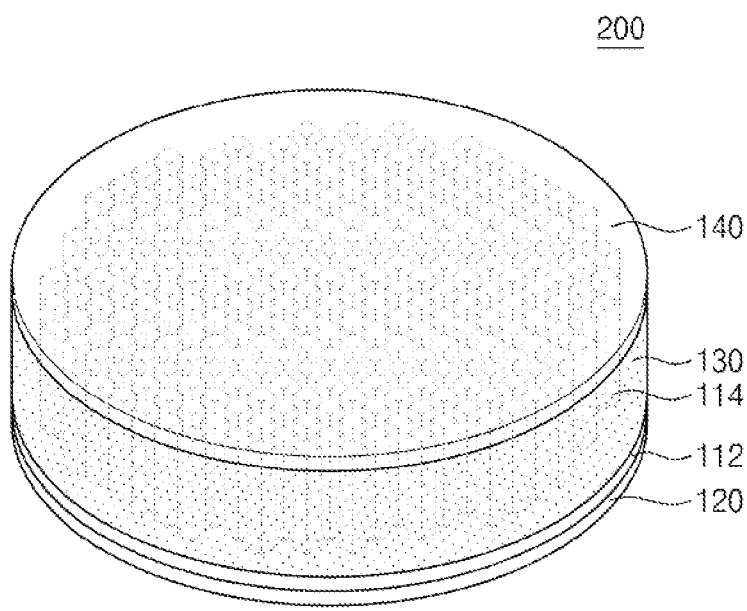
FIGS. 3 through 5 are combined perspective views illustrating a charging device that is configured to include a piezoelectric composite according to other example embodiments of the inventive concept.
Figure 4:
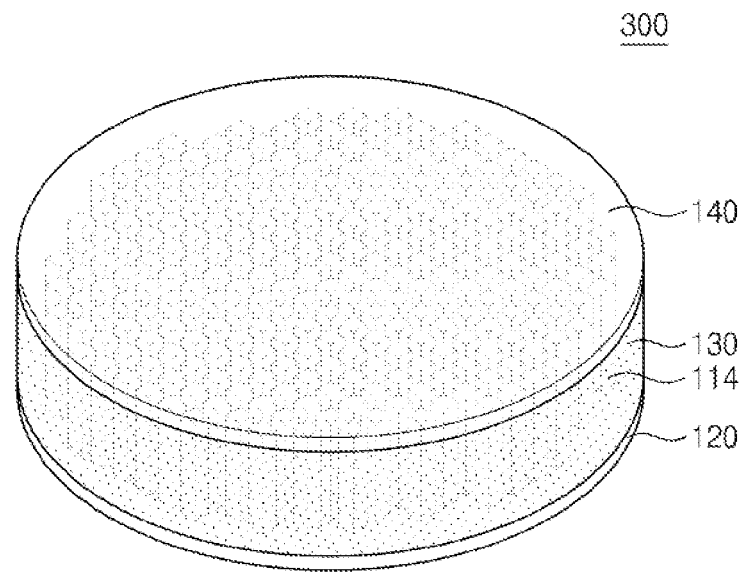
Figure 5:
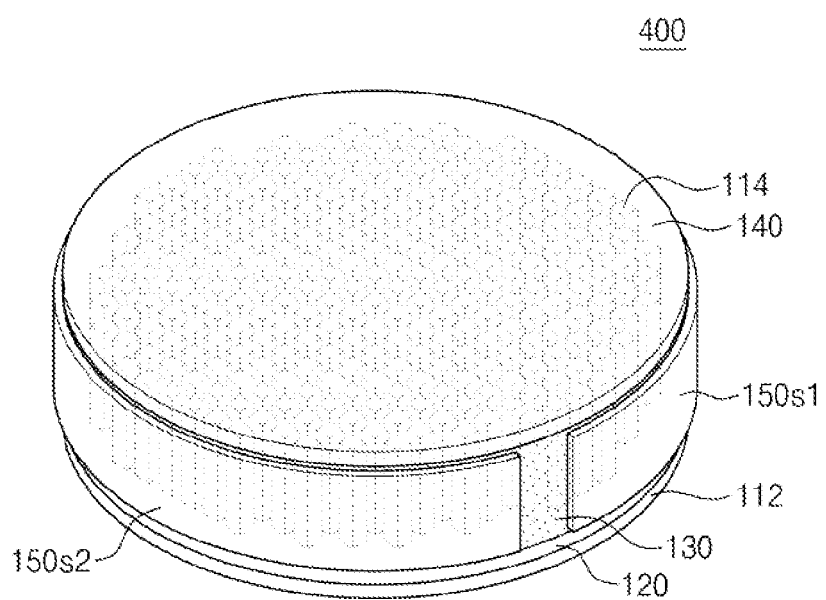

FIGS. 3 through 5 are combined perspective views illustrating a charging device that is configured to include a piezoelectric composite according to other example embodiments of the inventive concept. For concise description, a previously described element may be identified by a similar or identical reference number without repeating an overlapping description thereof.

A charging device of FIG. 3 may be configured to have substantially the same technical features as that of the previous embodiment, except for a modification in structure of the lower electrode 120.

The lower electrode 120 may be provided below the piezoelectric composite supporting part 112. Here, unlike the previous embodiments described with reference to FIGS. 1 and 2, there is no need to form the through holes, which may be provided to correspond to the pillar-shaped piezoelectric composites 114, in the lower electrode 120.

A charging device of FIG. 4 may be configured to have substantially the same technical features as that of the previous embodiment, except for a modification in structure of the piezoelectric composite.

The piezoelectric composite may be constituted by only the pillar-shaped piezoelectric composites 114, without the piezoelectric composite supporting part 112. In this case, the pillar-shaped piezoelectric composites 114 may be provided on one side of the lower electrode 120 and another side of the upper electrode 140 as shown in FIG. 4. Here, unlike the previous embodiments described with reference to FIGS. 1 and 2, there is no need to form the through holes, which may be provided to correspond to the pillar-shaped piezoelectric composites 114, in the lower electrode 120. Accordingly, the charging device 300 according to the present embodiment can have a more simple structure, compared with the charging device 100 described with reference to FIGS. 1 and 2.

A charging device of FIG. 5 may be configured to have substantially the same technical features as that of the previous embodiment, except for a modification in structure of electrodes.

The charging device 400 may further including sidewall electrodes 150s1 and 150s2 disposed on a sidewall of the electrolyte layer 130. The sidewall electrodes 150s1 and 150s2 may surround the electrolyte layer 130 and may be spaced apart from each other. Also, the sidewall electrodes 150s1 and 150s2 may be spaced apart from the lower and upper electrodes 120 and 140. Here, the lower and upper electrodes 120 and 140 may be used as a charging electrode and the sidewall electrodes 150s1 and 150s2 may be used as a discharging electrode. In other words, the sidewall electrodes 150s1 and 150s2 may serve an anode and a cathode of the charging device 400.

The charging devices according to example embodiments of the inventive concept may include the pillar-shaped piezoelectric composites and the electrolyte layer provided therebetween, and thus, the charging devices can emit or receive an ultrasonic wave or store an electric power that is produced from the pillar-shaped piezoelectric composite or is used to operate the pillar-shaped piezoelectric composite. Accordingly, the charging device can be applied to realize an ultrasonic apparatus, such as a sensor node for in-water ubiquitous sensor network or a wireless charging power module provided in human body.

Figure 6:
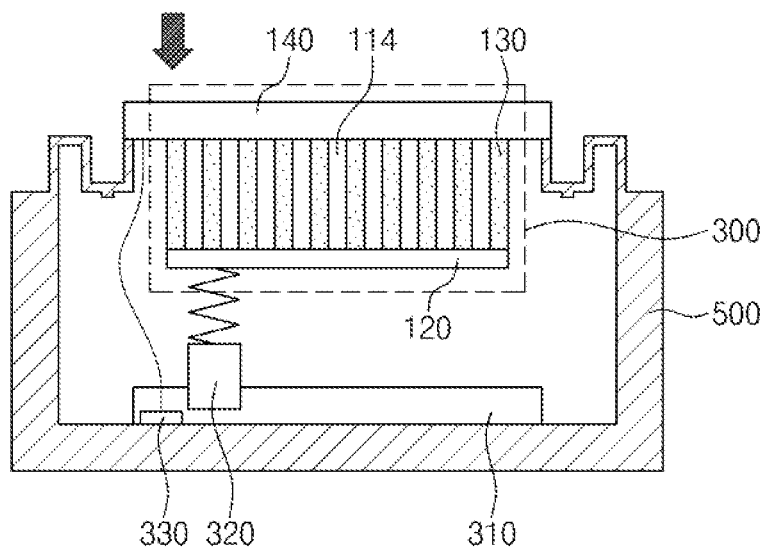
FIG. 6 is a schematic sectional view illustrating an ultrasonic apparatus according to example embodiments of the inventive concept.

FIG. 6 is a schematic sectional view illustrating an ultrasonic apparatus according to example embodiments of the inventive concept.

Referring to FIG. 6, provided are a charging device 300, a circuit device 310 electrically connected to the charging device 300, and a housing part 500 for packaging the charging device 300 and the circuit device 310.

The charging device 300 may include the lower electrode 120, the upper electrode 140, the pillar-shaped piezoelectric composites 114 disposed between the lower electrode 120 and the upper electrode 140, and the electrolyte layer 130 filling spaces between the pillar-shaped piezoelectric composites 114.

The circuit device 310 may be provided in the housing part 500 and be connected to the lower and upper electrodes 120 and 140 of the charging device 300. The circuit device 310 may be provided in a form of the printed circuit board (PCB). The circuit device 310 may include a first electrode 320 connected to the lower electrode 120 of the charging device 300 and a second electrode 330 connected to the upper electrode 140 of the charging device 300, respectively. This connections between the first and second electrodes 320 and 330 of the circuit device 310 and the lower and upper electrodes 120 and 140 of the charging device 300 may be changed each other.

The first electrode 320 of the circuit device 310 may be connected to the lower electrode 120 of the charging device 300 through a spring-shaped wire. This makes it possible to prevent the first electrode 320 and the lower electrode 120 from being disconnected by an external force, such as vibration or pressure, applied to the upper electrode 140 of the charging device 300.

Similarly, the second electrode 330 of the circuit device 310 may be connected to the upper electrode 140 of the charging device 300 through a spring-shaped wire. Alternatively, in the case where the second electrode 330 is connected to the housing part 500 and the housing part 500 includes a conductive material, there is no need to provide a wire between the second electrode 330 and the upper electrode 140. This is because the housing part 400 including the conductive material can serve as a wire.

The upper electrode 140 may be used as a part of the housing 500. In this case, the housing part 500 may be configured to have a structure that can be deformed, in the vertical direction, by an external force, such as vibration or pressure, applied from the outside.

According to example embodiments of the inventive concept, the ultrasonic apparatus may include a charging device with pillar-shaped piezoelectric composites and an electrolyte layer filling spaces therebetween. Here, the pillar-shaped piezoelectric composites may be used to emit or receive an ultrasonic wave, and the electrolyte layer may be used to store an electric power that is produced from the pillar-shaped piezoelectric composite or is used to operate the pillar-shaped piezoelectric composite. Accordingly, it is possible to realize an ultrasonic apparatus with a remarkably reduced size, an improved impedance matching property, and an optimized performance property. Since the ultrasonic apparatus can have high radiation efficiency in water or human body, it can be used for applications, such as a sensor node for in-water ubiquitous sensor network or a wireless charging power module provided in human body.

While example embodiments of the inventive concepts have been particularly shown and described, it will be understood by one of ordinary skill in the art that variations in form and detail may be made therein without departing from the spirit and scope of the attached claims.

What is claimed is:

1. A charging device, comprising:
a lower electrode;
an upper electrode provided over the lower electrode;
a plurality of pillar-shaped piezoelectric composites provided between the lower and upper electrodes;
an electrolyte layer provided between the lower and upper electrodes and filling spaces between the pillar-shaped piezoelectric composites; and
a piezoelectric composite supporting part provided below the lower electrode and supporting the pillar-shaped piezoelectric composites,
wherein the lower electrode has through holes corresponding to the pillar-shaped piezoelectric composites.

2. The charging device of claim 1, wherein the pillar-shaped piezoelectric composites comprise a piezoelectric material and a polymer surrounding the piezoelectric material, and the piezoelectric material has a transverse length shorter than a longitudinal length.

3. The charging device of claim 1, wherein the pillar-shaped piezoelectric composites comprise a 1-3 mode piezoelectric composite.

4. The charging device of claim 1, wherein the pillar-shaped piezoelectric composites each have a transverse cross section shaped like a circle or polygon.

5. The charging device of claim 1, wherein the electrolyte layer is a gel-type or solid-type.

6. The charging device of claim 5, wherein the electrolyte layer is the solid-type, and the electrolyte layer has through holes corresponding to the pillar-shaped piezoelectric composites.

7. The charging device of claim 1, wherein the electrolyte layer comprises a monomer or polymer electrolyte material.

8. The charging device of claim 1, further comprising sidewall electrodes disposed on a sidewall of the electrolyte layer,
wherein the sidewall electrodes are spaced apart from each other and are spaced apart from the lower and upper electrodes, and
wherein the lower and upper electrodes are used as a charging electrode, and the sidewall electrodes are used as a discharging electrode.

9. The charging device of claim 1, wherein the electrolyte layer has a cylindrical shape, wherein the upper electrode is disposed on a top surface of the electrolyte layer, and wherein the lower electrode is disposed on a bottom surface of the electrolyte layer.

10. An ultrasonic apparatus, comprising:
a circuit device electrically coupled to the charging device;
a housing part packaging the charging device and the circuit device; and
a charging device including:
   a lower electrode;
   an upper electrode provided over the lower electrode;
   a plurality of pillar-shaped piezoelectric composites provided between the lower and upper electrodes;
   an electrolyte layer provided between the lower and upper electrodes and filling spaces between the pillar-shaped piezoelectric composites; and
   a piezoelectric composite supporting part provided below the lower electrode and supporting the pillar-shaped piezoelectric composites,
   wherein the lower electrode has through holes corresponding to the pillar-shaped piezoelectric composites.

11. The ultrasonic apparatus of claim 10, wherein the pillar-shaped piezoelectric composites each have a transverse length shorter than a longitudinal length.

12. The ultrasonic apparatus of claim 10, wherein the pillar-shaped piezoelectric composites comprise a 1-3 mode piezoelectric material.

13. The ultrasonic apparatus of claim 10, wherein the pillar-shaped piezoelectric composites each have a transverse cross section shaped like a circle or polygon.

14. The ultrasonic apparatus of claim 10, wherein the electrolyte layer is a gel-type or solid-type.

15. The ultrasonic apparatus of claim 14, wherein the electrolyte layer is the solid-type, and the electrolyte layer has through holes corresponding to the pillar-shaped piezoelectric composites.

16. The ultrasonic apparatus of claim 10, wherein the electrolyte layer comprises a monomer or polymer electrolyte material.

17. The ultrasonic apparatus of claim 10, wherein the lower and upper electrodes each have a transverse cross section shaped like a circle or polygon.

18. The ultrasonic apparatus of claim 10, wherein the circuit device is a printed circuit board.

19. The charging device of claim 10, wherein the electrolyte layer has a cylindrical shape,
wherein the upper electrode is disposed on a top surface of the electrolyte layer, and
wherein the lower electrode is disposed on a bottom surface of the electrolyte layer.

20. A charging device, comprising:
a lower electrode;
an upper electrode provided over the lower electrode;
a plurality of pillar-shaped piezoelectric composites provided between the lower and upper electrodes;
an electrolyte layer provided between the lower and upper electrodes to fill spaces between the pillar-shaped piezoelectric composites; and
a piezoelectric composite supporting part provided on the lower electrode to support the pillar-shaped piezoelectric composites.

* * * * *